US011205678B2

(12) United States Patent
Dutta et al.

(10) Patent No.: US 11,205,678 B2
(45) Date of Patent: Dec. 21, 2021

(54) EMBEDDED MRAM DEVICE WITH TOP VIA

(71) Applicant: International Business Machines Corporation, Armonk, NY (US)

(72) Inventors: Ashim Dutta, Menands, NY (US); Ekmini Anuja De Silva, Slingerlands, NY (US); Dominik Metzler, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 97 days.

(21) Appl. No.: 16/780,684

(22) Filed: Feb. 3, 2020

(65) Prior Publication Data

US 2021/0242277 A1 Aug. 5, 2021

(51) Int. Cl.
*H01L 27/22* (2006.01)
*H01L 43/12* (2006.01)
*H01L 43/02* (2006.01)

(52) U.S. Cl.
CPC ............ *H01L 27/222* (2013.01); *H01L 43/02* (2013.01); *H01L 43/12* (2013.01)

(58) Field of Classification Search
CPC ........ H01L 27/222; H01L 43/02; H01L 43/12
USPC ....................................................... 257/427
See application file for complete search history.

(56) References Cited

U.S. PATENT DOCUMENTS

| 6,521,931 | B2 | 2/2003 | Sandhu et al. |
| 7,838,436 | B2 | 11/2010 | Xiao et al. |
| 8,456,883 | B1* | 6/2013 | Liu ...................... H01L 27/0688 365/66 |
| 8,735,179 | B2 | 5/2014 | Li et al. |
| 9,190,260 | B1 | 11/2015 | Zhang et al. |
| 9,780,301 | B1 | 10/2017 | Chuang et al. |
| 10,008,387 | B1* | 6/2018 | Wang ...................... H01L 43/12 |
| 2010/0123207 | A1* | 5/2010 | Zhong ..................... H01L 43/12 257/421 |
| 2013/0119494 | A1 | 5/2013 | Li et al. |
| 2015/0069561 | A1* | 3/2015 | Tan ........................ H01L 27/228 257/421 |
| 2016/0133828 | A1 | 5/2016 | Lu et al. |
| 2017/0025471 | A1* | 1/2017 | Bhushan ................. H01L 43/12 |
| 2018/0261649 | A1 | 9/2018 | Annunziata et al. |

OTHER PUBLICATIONS

Paolillo et al., "Direct metal etch of ruthenium for advanced interconnect," Journal of Vacuum Science & Technology B, vol. 36, No. 3, May/Jun. 2018, 03E103, 9 pages.

* cited by examiner

*Primary Examiner* — Jami Valentine Miller
(74) *Attorney, Agent, or Firm* — Abdy Raissinia; Michael J. Chang, LLC

(57) ABSTRACT

Techniques for integrating an embedded MRAM device with a BEOL interconnect structure are provided. In one aspect, a method of forming an embedded MRAM device includes: depositing a cap layer onto a substrate; forming a metal line and metal pad on the cap layer; patterning the metal line to form first top vias, and the metal pad to form a second top via; depositing a dielectric material onto the substrate surrounding the first/second top vias; recessing the second top via to form a bottom contact via self-aligned to the metal pad which serves as a bottom contact; forming an MRAM cell over the bottom contact via; and forming first/second top contacts in contact with the first top vias/the MRAM cell. An embedded MRAM device is also provided.

20 Claims, 16 Drawing Sheets

EMBEDDED MRAM DEVICE WITH TOP VIA

FIELD OF THE INVENTION

The present invention relates to magnetic random access memory (MRAM) devices, and more particularly, to techniques for integrating an embedded MRAM device with a back-end-of-line (BEOL) interconnect structure containing a top via.

BACKGROUND OF THE INVENTION

Magnetic random access memory (MRAM) devices employ a magnetic tunnel junction (MTJ) to store information. An MTJ includes a fixed magnetic metal layer(s) separated from a free magnetic metal layer(s) by a tunnel barrier. The orientation of the free magnetic layer(s) relative to that of the fixed magnetic layer(s) is used to store the information, e.g., as a logic "1" or logic "0." The MTJ is often sandwiched between a top electrode and a bottom electrode.

MRAM devices can be embedded in an integrated circuit design having back-end-of-line (BEOL) interconnect configurations employing a top via scheme for logic components. MRAM devices are typically formed by depositing the various layers of the device (including the MTJ), and then patterning the layers into individual memory cell pillars using a process such as ion beam etching. However, with embedded MRAM designs a significant gouging of the dielectric underlying the bottom electrode occurs during the MTJ stack etch. In extreme cases, this gouging can remove so much of the underlying dielectric that the lower interconnect levels become exposed, which is undesirable as exposed copper lines can lead to shorting, copper contamination during downstream processes, etc.

Further, with conventional approaches the contact to the bottom electrode of the MRAM device cannot be made much smaller than the bottom critical dimension of the MRAM pillars due to metal fill challenges. In that case, a small misalignment of the MRAM pillar with the underlying interconnect can lead to sputtering of bottom electrode contact metal and redeposition of the metal onto the MTJ pillar sidewall resulting in device shorts. Also, for advanced node conventional damascene via in the logic area will have a higher aspect ratio which can potentially cause contact fill issues such as void formation.

Thus, improved embedded MRAM BEOL interconnect configurations employing a top via scheme would be desirable.

SUMMARY OF THE INVENTION

The present invention provides techniques for integrating an embedded magnetic random access memory (MRAM) device with a back-end-of-line (BEOL) interconnect structure containing a top via. In one aspect of the invention, a method of forming an embedded MRAM device is provided. The method includes: depositing a cap layer onto a substrate, wherein the substrate includes a logic-to-memory boundary area separating a logic area of the substrate from a memory area of the substrate; forming a metal line on the cap layer over the logic area of the substrate, and a metal pad on the dielectric cap layer over the memory area of the substrate; patterning i) the metal line to form first top vias over an unpatterned portion of the metal line, and ii) the metal pad to form a second top via over an unpatterned portion of the metal pad; depositing a dielectric material onto the substrate surrounding the first top vias and the second top via; recessing the second top via and the dielectric material in the memory area of the substrate, wherein following the recessing what remains of the second top via serves as a bottom contact via that is self-aligned to the unpatterned portion of the metal pad which serves as a bottom contact; forming an MRAM cell over the bottom contact via in the memory area of the substrate; and forming first top contacts in contact with the first top vias and a second top contact in contact with the MRAM cell.

In another aspect of the invention, another method of forming an embedded MRAM device is provided. The method includes: depositing a cap layer onto a substrate, wherein the substrate includes a logic-to-memory boundary area separating a logic area of the substrate from a memory area of the substrate; forming a metal line on the cap layer over the logic area of the substrate, and a metal pad on the dielectric cap layer over the memory area of the substrate; patterning i) the metal line to form first top vias over an unpatterned portion of the metal line, and ii) the metal pad to form a second top via over an unpatterned portion of the metal pad; depositing a dielectric material onto the substrate surrounding the first top vias and the second top via; recessing the second top via and the dielectric material in the memory area of the substrate, wherein following the recessing what remains of the second top via serves as a bottom contact via that is self-aligned to the unpatterned portion of the metal pad which serves as a bottom contact; forming an MRAM stack on the dielectric material over the first top vias in the logic area of the substrate and over the bottom contact via in the memory area of the substrate, wherein the MRAM stack includes a bottom electrode layer, a magnetic tunnel junction (MTJ) layer disposed on the bottom electrode layer, and a top electrode layer disposed on the MTJ layer; patterning the MRAM stack to form an MRAM cell over the bottom contact via in the memory area of the substrate; depositing an interlayer dielectric (ILD) onto the dielectric material over the first top vias and the MRAM cell; recessing the ILD to expose the first top vias and the MRAM cell; and forming first top contacts and a second top contact over the ILD, wherein the first top contacts are in contact with the first top vias and the second top contact is in contact with the MRAM cell.

In yet another aspect of the invention, an embedded MRAM device is provided. The embedded MRAM device includes: a substrate having a logic-to-memory boundary area separating a logic area of the substrate from a memory area of the substrate; a cap layer disposed on the substrate; a metal line disposed on the cap layer over the logic area of the substrate; a metal pad disposed on the cap layer over the memory area of the substrate; top vias formed on the metal line; a bottom contact via self-aligned to the metal pad, wherein the metal pad serves as a bottom contact of the MRAM device; a dielectric material disposed on the substrate over the metal line and the metal pad and surrounding the top vias and the bottom contact via; an MRAM cell formed over the bottom contact via in the memory area of the substrate; spacers along sidewalls of the MRAM cell, wherein the spacers include a material selected from: silicon nitride (SiN), silicon carbon nitride (SiCN) and/or hydrogen containing silicon carbon nitride (SiCNH); first top contacts in contact with the top vias; and a second top contact in contact with the MRAM cell.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for forming embedded magnetic random access memory (MRAM) devices in a memory area of an integrated circuit with a back-end-of-line (BEOL) interconnect structure containing a top via in a logic area of the integrated circuit formed using subtractive patterning for both logic area contact formation and memory area bottom electrode contact formation which advantageously avoids the above-described metal fill limitations associated with conventional damascene via production. In addition, the present top via formed using subtractive etch process is self-aligned with the underlying metal line or metal pad which eliminates risk of high contact resistance due to misalignment. As will be described in detail below, instead of traditional conductors such as copper (Cu), alternative metals such as ruthenium (Ru), cobalt (Co) and/or tungsten (W) are employed herein to enable a direct metal etch to be used to form a self-aligned bottom contact in the memory area and self-aligned top vias in the logic area of the circuit design. Namely, traditional conductors such as Cu do not provide any volatile product while reacting with common etchant gases (fluorine, chlorine, oxygen, hydrogen, etc.). As a result, Cu has too slow of an etch rate to enable subtractive etching of Cu lines and contacts.

Figure 1:
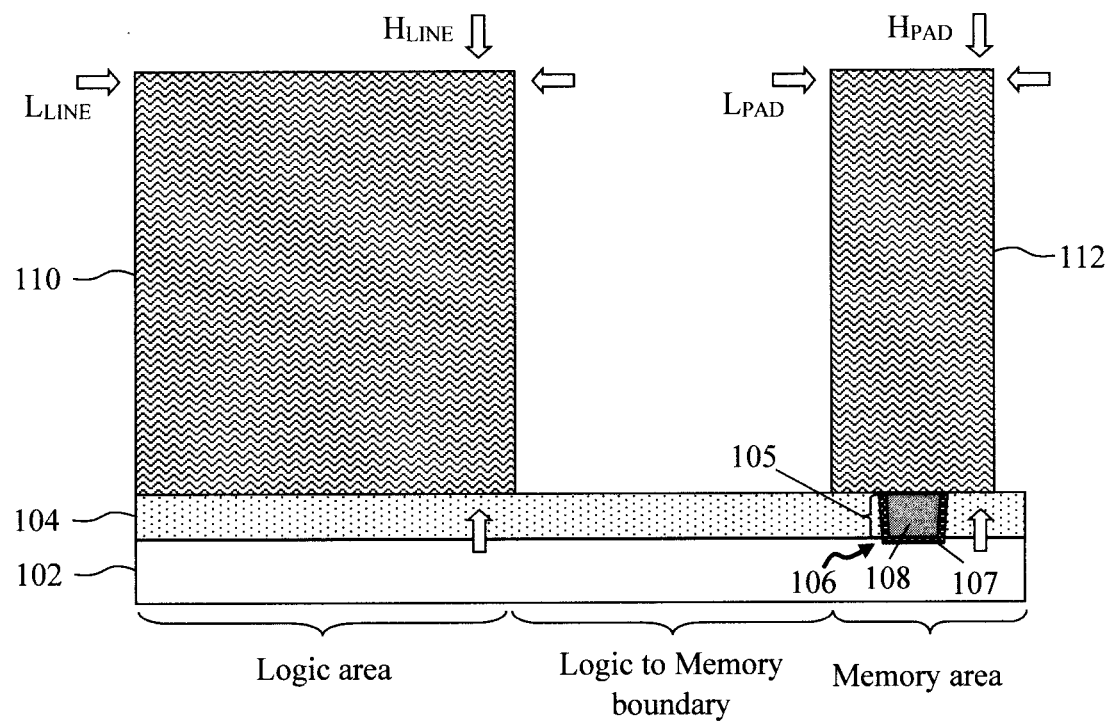
FIG. 1 is a cross-sectional diagram illustrating a substrate having a dielectric cap layer disposed thereon, and a metal line and metal pad having been formed on the dielectric cap layer over a logic area and a memory area of the substrate, respectively, according to an embodiment of the present invention.
Figure 2:
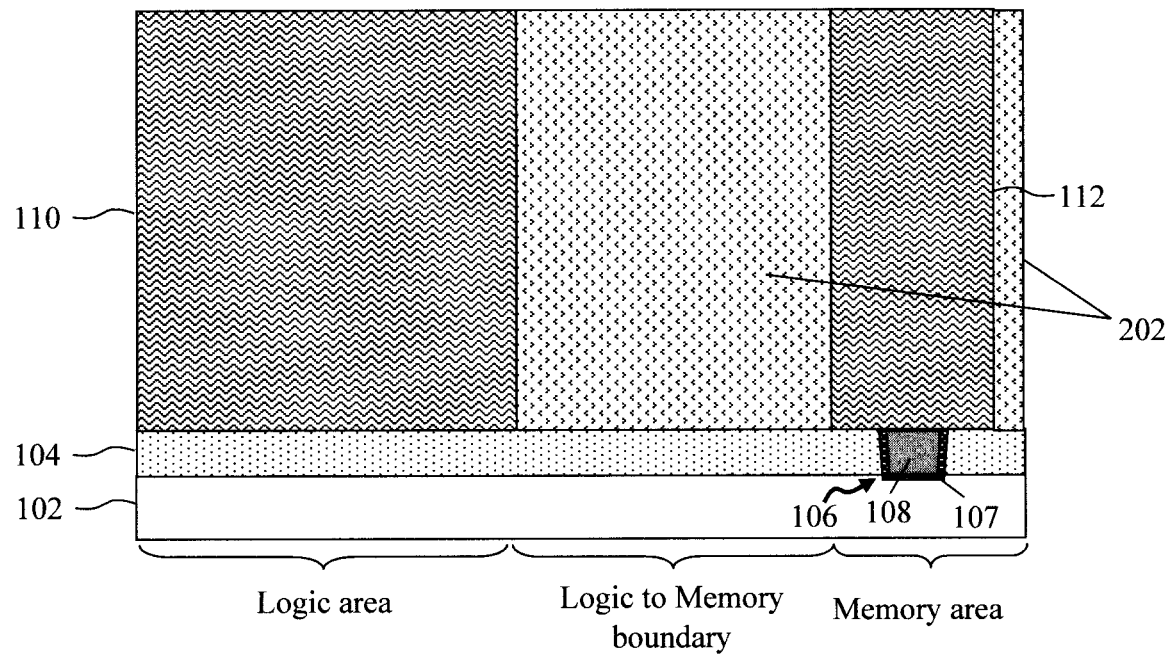
FIG. 2 is a cross-sectional diagram illustrating a (first) interlayer dielectric (ILD) having been deposited onto the substrate over the dielectric cap layer and surrounding the metal line and metal pad according to an embodiment of the present invention.
Figure 3:
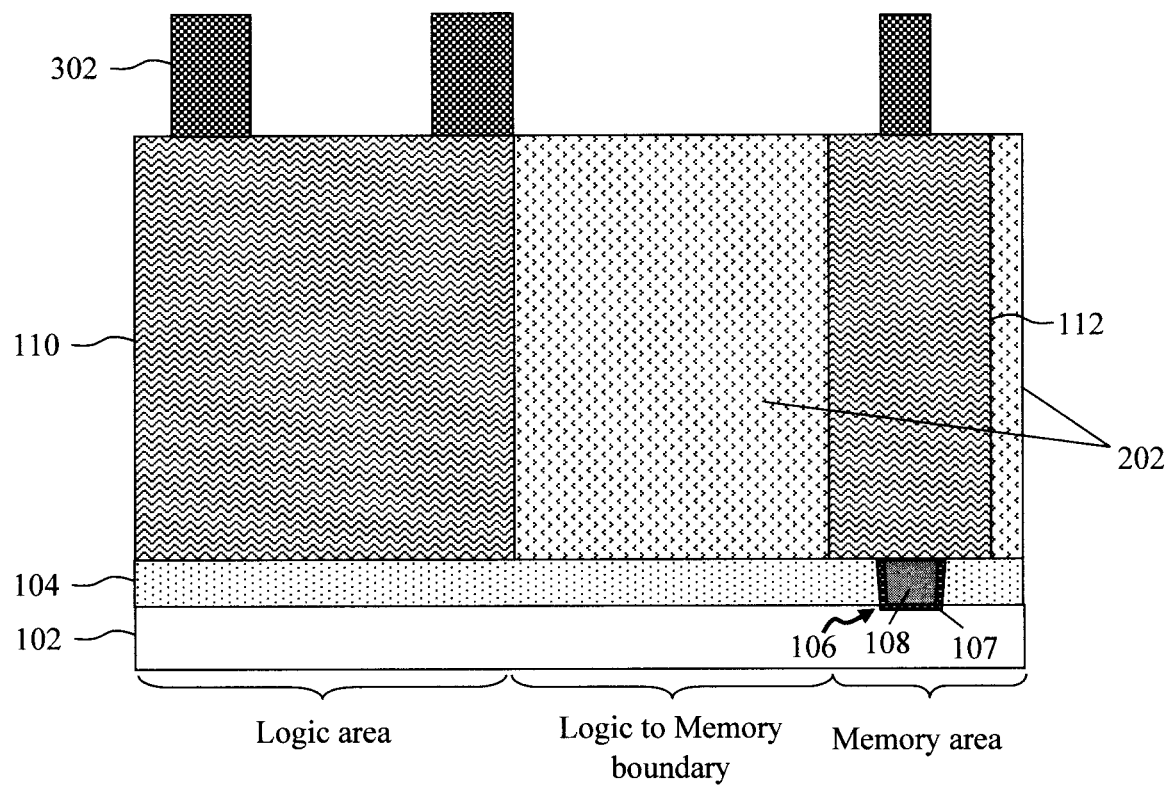
FIG. 3 is a cross-sectional diagram illustrating a patterned hardmask having been formed on the metal line and metal pad according to an embodiment of the present invention.

An exemplary methodology for forming an MRAM device in now described by way of reference to FIGS. 1-19. As shown in FIG. 1, the process begins with a substrate 102 having a dielectric cap layer 104 disposed thereon. According to an exemplary embodiment, substrate 102 is a bulk semiconductor wafer, such as a bulk silicon (Si), bulk germanium (Ge), bulk silicon germanium (SiGe) and/or bulk III-V semiconductor wafer. Alternatively, substrate 102 can be a semiconductor-on-insulator (SOI) wafer. A SOI wafer includes a SOI layer separated from an underlying substrate by a buried insulator. When the buried insulator is an oxide it is referred to herein as a buried oxide or BOX. The SOI layer can include any suitable semiconductor, such as Si, Ge, SiGe, and/or a III-V semiconductor. Substrate 102 may already have pre-built structures (not shown) such as transistors, diodes, capacitors, resistors, isolation regions (e.g., shallow trench isolation (STI) regions), interconnects, wiring, etc.

As shown in FIG. 1, substrate 102 includes at least one memory area and at least one logic area. A logic-to-memory boundary of substrate 102 separates the memory area from the logic area. As will be described in detail below, a bottom contact and bottom contact via (for an MRAM cell) will be formed in the memory area, and top vias will be formed in the logic area.

Suitable materials for dielectric cap layer 104 include, but are not limited to, materials such as silicon oxide (SiOx), silicon carbide (SiC), silicon nitride (SiN), silicon carbon nitride (SiCN) and/or hydrogen containing silicon carbon nitride (SiCNH). Dielectric cap layer 104 can be deposited onto substrate 102 using a process such as chemical vapor deposition (CVD), atomic layer deposition (ALD) or physical vapor deposition (PVD). According to an exemplary embodiment, dielectric cap layer 104 has a thickness of from about 20 nanometers (nm) to about 100 nm and ranges therebetween.

According to an exemplary embodiment, at least one conductive via 106 is present in the dielectric cap layer 104 over the memory area of substrate 102. To form conductive via 106 in dielectric cap layer 104, standard lithography and etching techniques can be employed to pattern a via 105 in dielectric cap layer 104. A directional (anisotropic) etching process such as reactive ion etching (RIE) can be employed for patterning the via. The via 105 is then filled with a contact metal or metals 108 to form the conductive via 106. Suitable contact metals include, but are not limited to, copper (Cu), nickel (Ni), platinum (Pt), Ru, Co, and/or W. The contact metal(s) 108 can be deposited into the via 105 using a process such as evaporation, sputtering, or electrochemical plating. Following deposition, the metal overburden can be removed using a process such as chemical-mechanical polishing (CMP).

Prior to depositing the contact metal(s) 108 into via 105, a conformal barrier layer 107 can be deposited into and lining the via 105. Use of such a barrier layer 107 helps to prevent diffusion of the contact metal(s) into the surrounding dielectric. Suitable barrier layer 107 materials include, but are not limited to, Ru, tantalum (Ta), tantalum nitride (TaN), titanium (Ti), and/or titanium nitride (TiN). Additionally, a seed layer (not shown) can be deposited into and lining the via 105 prior to the contact metal(s) 108 deposition. A seed layer facilitates plating of the contact metal(s) 108 into the via 105.

A metal line 110 and a metal pad 112 are then formed on the dielectric cap layer 104 over the logic area and the memory area of substrate 102, respectively. See FIG. 1. According to an exemplary embodiment, the metal line 110 and metal pad 112 are formed by first depositing a metal(s), and then using standard lithography and etching techniques to pattern the metal(s) into the individual metal line 110 and metal pad 112 shown in FIG. 1. A directional (anisotropic) etching process such as RIE can be employed for the metal line 110 and metal pad 112 etch.

As provided above, alternative metals are preferably employed in the present interconnect design. For instance, suitable metals for metal line 110 and metal pad 112 include, but are not limited to, Ru, Co and/or W. The metal(s) for metal line 110 and metal pad 112 can be deposited onto dielectric cap layer 104 using a process such as evaporation, sputtering, or electrochemical plating. Following deposition, the metal can be planarized using a process such as CMP.

According to an exemplary embodiment, metal line 110 has a width (the dimension of metal line 110 extending into and out of the page) of from about 10 nanometers (nm) to about 100 nm and ranges therebetween, a length $L_{LINE}$ of from about 100 nm to about 500 nm and ranges therebetween, and a height $H_{LINE}$ of from about 20 nm to about 200 nm and ranges therebetween. According to an exemplary embodiment, metal pad 112 has a width (the dimension of metal pad 112 extending into and out of the page) of from about 20 nm to about 100 nm and ranges therebetween, a length $L_{PAD}$ of from about 100 nm to about 1000 nm and ranges therebetween, and a height $H_{PAD}$ of from about 50 nm to about 200 nm and ranges therebetween.

An interlayer dielectric (ILD) 202 is then deposited onto the substrate 102 over the dielectric cap layer 104 and surrounding the metal line 110 and metal pad 112. See FIG. 2. Suitable ILD 202 materials include, but are not limited to, oxide low-κ materials such as silicon oxide (SiOx) and/or oxide ultralow-κ interlayer dielectric (ULK-ILD) materials, e.g., having a dielectric constant κ of less than 2.7. By comparison, silicon dioxide ($SiO_2$) has a dielectric constant κ value of 3.9. Suitable ultralow-κ dielectric materials include, but are not limited to, porous organosilicate glass (pSiCOH).

A process such as CVD, ALD or PVD can be employed to deposit the ILD 202. Following deposition, the ILD 202 can be planarized using a process such as CMP. According to an exemplary embodiment, the ILD 202 has a thickness of from about 3 nm to about 18 nm and ranges therebetween.

A patterned hardmask 302 is then formed on the metal line 110 and metal pad 112 marking the footprint and location of metal top vias to be patterned over the logic area and the memory area of substrate 102, respectively. See FIG. 3. It is notable, however, that the metal top via in the memory area of substrate 102 will later be etched to form the self-aligned bottom contact and bottom contact via beneath the MRAM cell. Suitable hardmask 302 materials include, but are not limited to, silicon nitride (SiN) and/or silicon dioxide ($SiO_2$).

Figure 4:
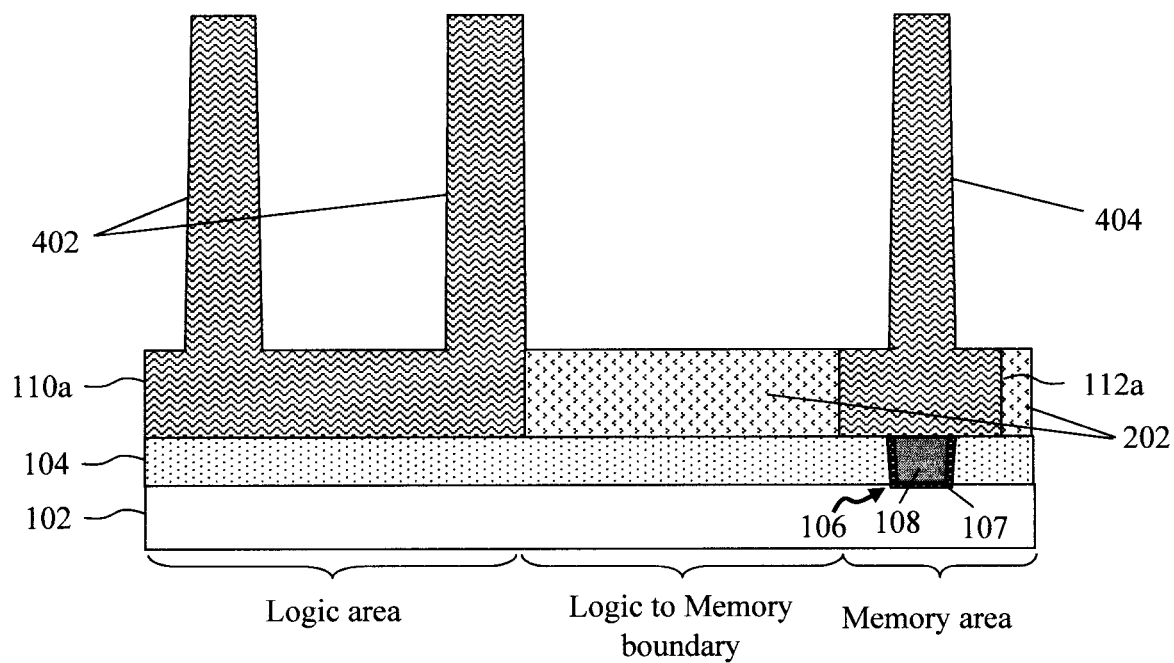
FIG. 4 is a cross-sectional diagram illustrating an etch using the hardmask having been employed to pattern (first) top via(s) in the metal line and a (second) top via in the metal pad over the logic area and the memory area of the substrate, respectively, and the ILD having been recessed according to an embodiment of the present invention.
Figure 5:
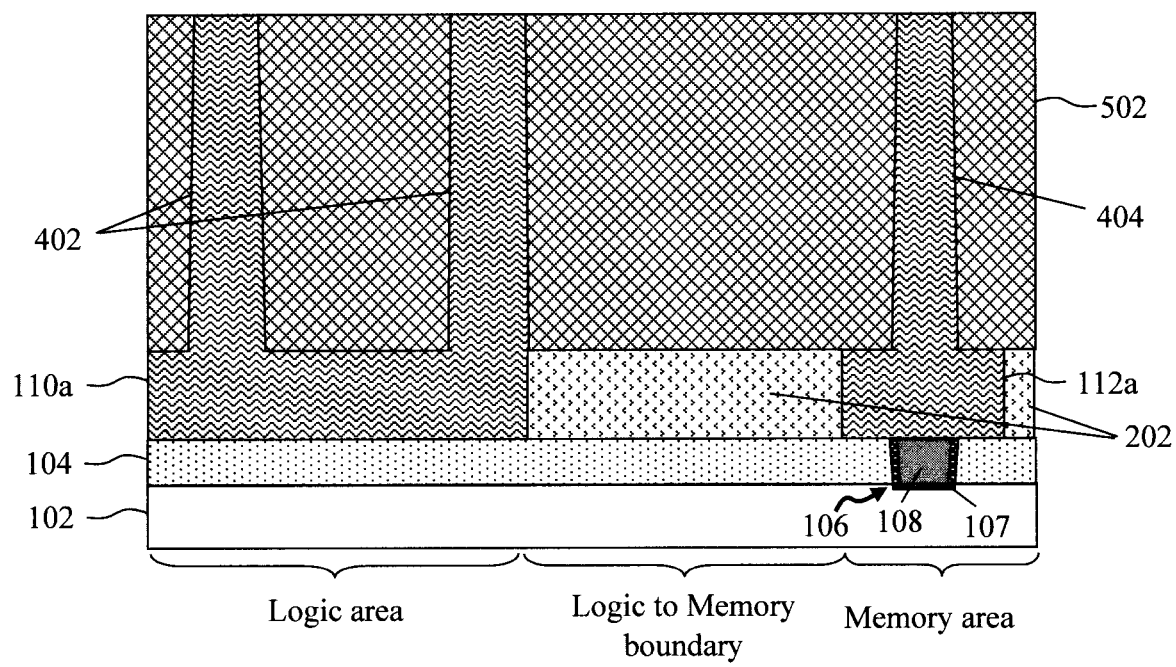
FIG. 5 is a cross-sectional diagram illustrating a dielectric material having been deposited onto the substrate/recessed over unpatterned portions of the metal line and metal pad, and surrounding the first/second top vias over the logic area and the memory area of the substrate, respectively, according to an embodiment of the present invention.

An etch using the hardmask 302 is then employed to pattern (first) top via(s) 402 in the metal line 110 and a (second) top via 404 in the metal pad 112 over the logic area and the memory area of substrate 102, respectively. See FIG. 4. According to an exemplary embodiment, a directional (anisotropic) etching process such as RIE is used for the top via etch. As shown in FIG. 4, the etch is stopped when top vias 402 and 404 are formed extending partway through the metal line 110 and metal pad 112, respectively. The unpatterned portions of the metal line 110 and metal pad 112 underlying the top vias 402 and 404 are now given the reference numerals 110a and 112a, respectively. Any remaining hardmask 302 is then removed.

As shown in FIG. 4, according to an exemplary embodiment the ILD 202 is recessed during the top via 402/404 etch. This is, however, not a requirement, and embodiments are contemplated herein where the ILD 202 is not recessed by the top via 402/404 etch. A dielectric material 502 is then deposited onto the substrate 102/recessed ILD 202 as shown (or optionally unrecessed ILD 202—not shown) over the unpatterned portions of the metal line 110a and metal pad 112a, and surrounding the top vias 402 and top via 404 over the logic area and the memory area of substrate 102, respectively. See FIG. 5. Suitable dielectrics materials 502 include, but are not limited to, SiOx, SiC, SiN, SiCN and/or SiCNH. Dielectric material 502 can be deposited using a process such as CVD, ALD or PVD. Following deposition, the dielectric material 502 can be planarized using a process such as CMP.

Figure 6:
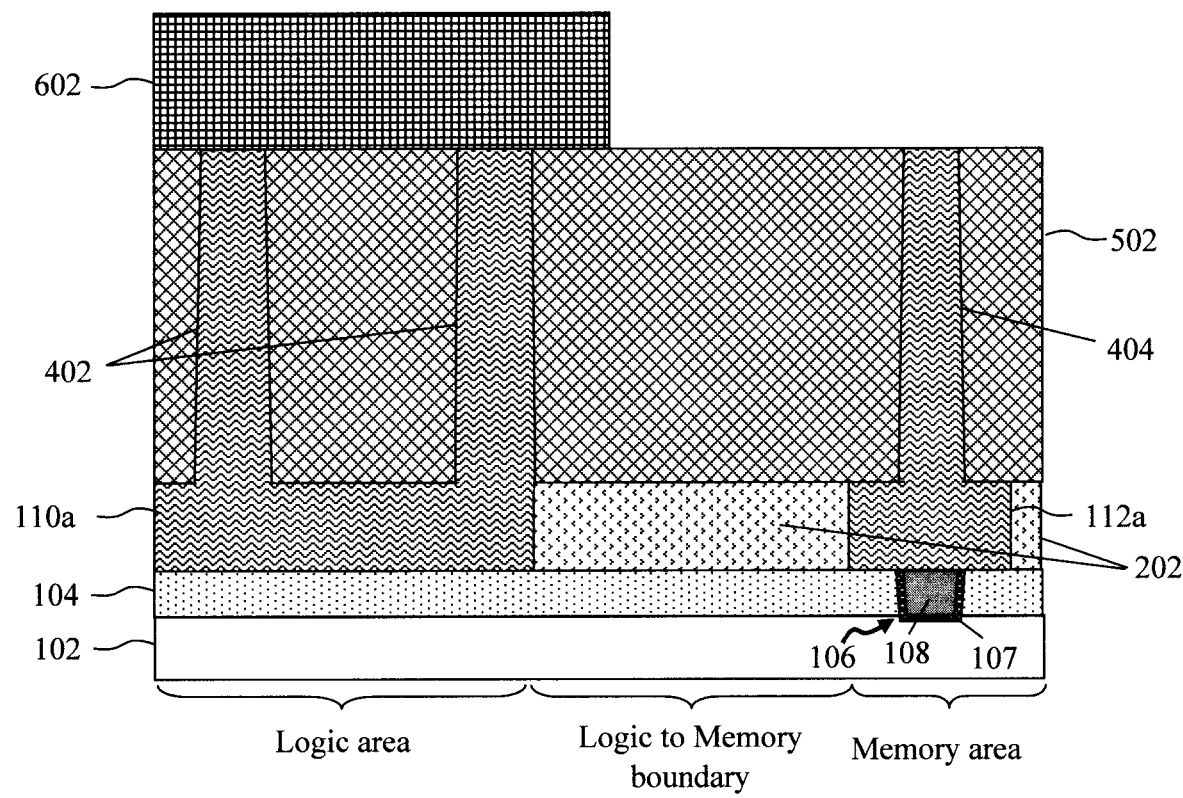
FIG. 6 is a cross-sectional diagram illustrating a patterned block mask having been formed on the dielectric material covering/masking the first top vias over the logic area of the substrate according to an embodiment of the present invention.

A patterned block mask 602 is next formed on dielectric material 502 covering/masking the top vias 402 over the logic area of substrate 102. See FIG. 6. As shown in FIG. 6, block mask 602 is present over the logic area and a portion of the logic-to-memory boundary of substrate 102. The memory area of substrate 102 remains uncovered. Standard lithography and (dry or wet) etching techniques (see above) can be employed to pattern the block mask. Suitable block mask materials include, but are not limited to, organic planarizing layer (OPL) materials.

Figure 7:
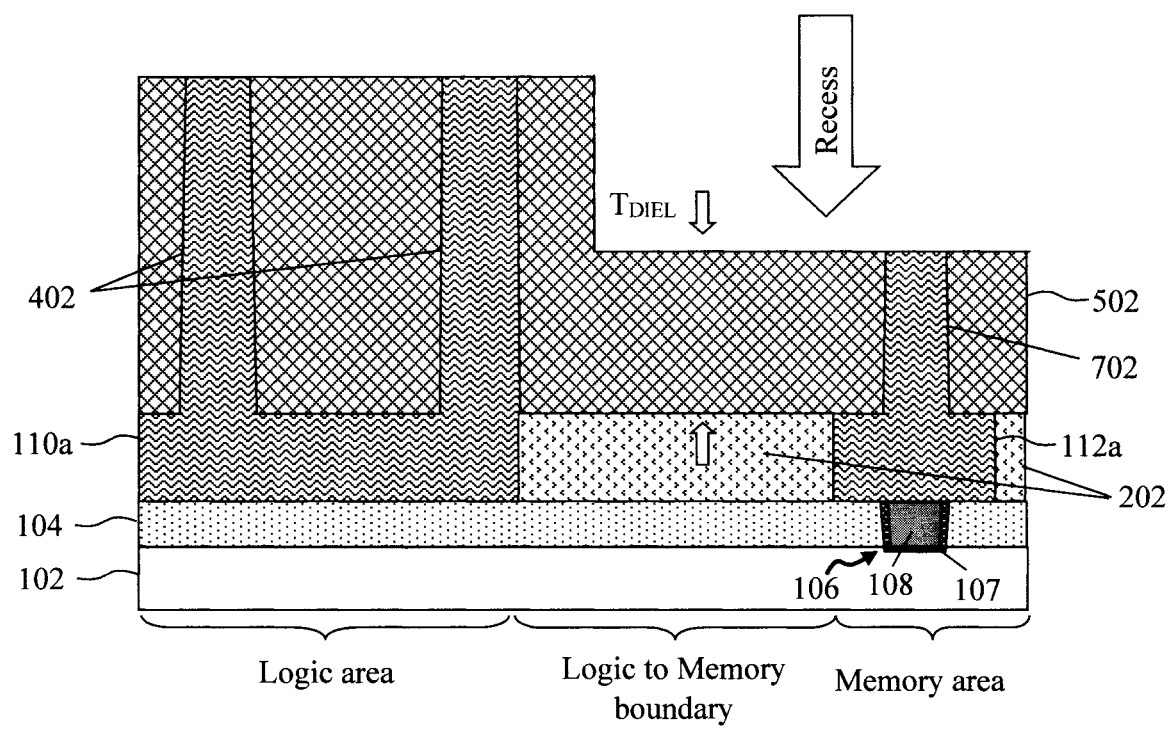
FIG. 7 is a cross-sectional diagram illustrating a recess etch of the second top via and dielectric material having been performed using the block mask in the memory area and an uncovered portion of a logic-to-memory boundary of the substrate, and the block mask having been removed, to form a bottom contact via over and in contact with the unpatterned portion of the metal pad which serves as a bottom contact according to an embodiment of the present invention.

A recess etch of the top via 404 and dielectric material 502 is then performed using the block mask 602 in the memory area and the uncovered portion of logic-to-memory boundary of substrate 102. See FIG. 7. A directional (anisotropic) etching process such as RIE can be employed for the recess etch. As shown in FIG. 7, the recess etch is stopped partway through the dielectric material 502 such that what remains of the top via 404 forms a bottom contact via 702 over and in contact with metal pad 112a. The unpatterned portion of the metal pad 112a serves as a bottom contact to the MRAM cell (to be formed as described below). Advantageously, by way of the present process, the bottom contact via 702 is self-aligned with the metal pad 112a/bottom contact. As provided above, conventional approaches can sometimes lead to misalignment of the bottom electrode of the MRAM cell with the underlying interconnect which can cause increased resistance, or even a disconnect in extreme cases.

Further, dielectric material 502 is unetched in the logic area of substrate 102 which, as will be described in detail below, provides protection for the underlying interconnects during the MRAM cell etch. Although it is recessed in the memory area of substrate 102, the dielectric material 502 that remains in the memory area of substrate 102 is of a sufficient thickness to prevent exposure of the underlying interconnects during the MRAM cell etch. For instance, according to an exemplary embodiment, the (recessed) dielectric material 502 has a thickness $T_{DIEL}$ of from about 50 nm to about 200 nm and ranges therebetween.

Following the recess etch, the block mask 602 is removed. See FIG. 7. A process such as ashing can be employed to remove the block mask 602.

An MRAM stack 802 is then formed on dielectric material 502. See FIG. 8. At this stage in the process, the MRAM stack 802 is formed on dielectric material 502 over both the top vias 402 and the bottom contact via 702 in the logic area and memory area of substrate 102, respectively. However, as will be described in detail below, subsequent patterning of the MRAM stack 802 will be used to selectively form an MRAM cell over the bottom contact via 702 and metal pad 112a/bottom contact in the memory area of substrate 102.

Figure 8:
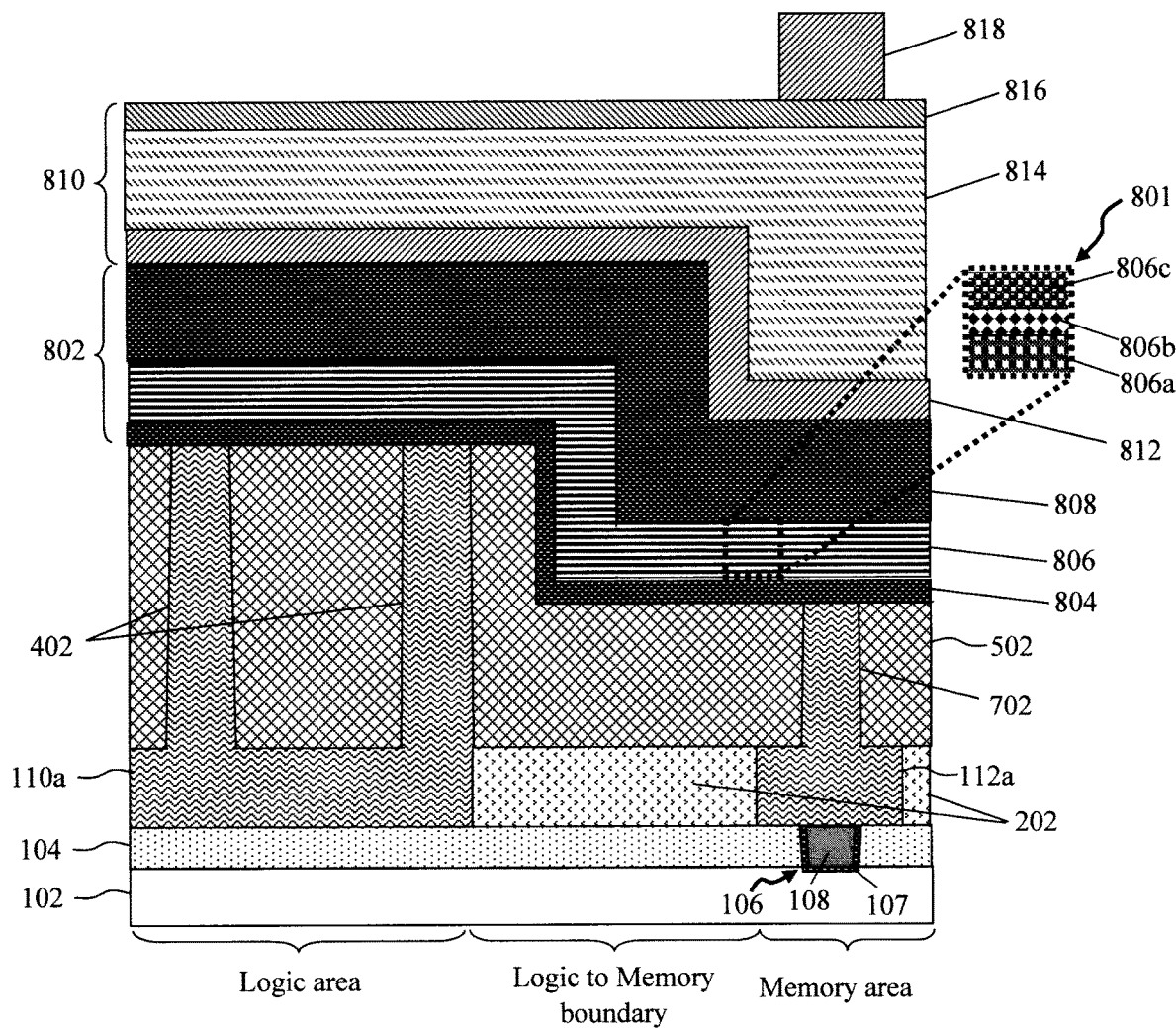
FIG. 8 is a cross-sectional diagram illustrating a magnetic random access memory (MRAM) stack having been formed on the dielectric material, and a lithographic stack having been formed on the MRAM stack according to an embodiment of the present invention.
Figure 9:
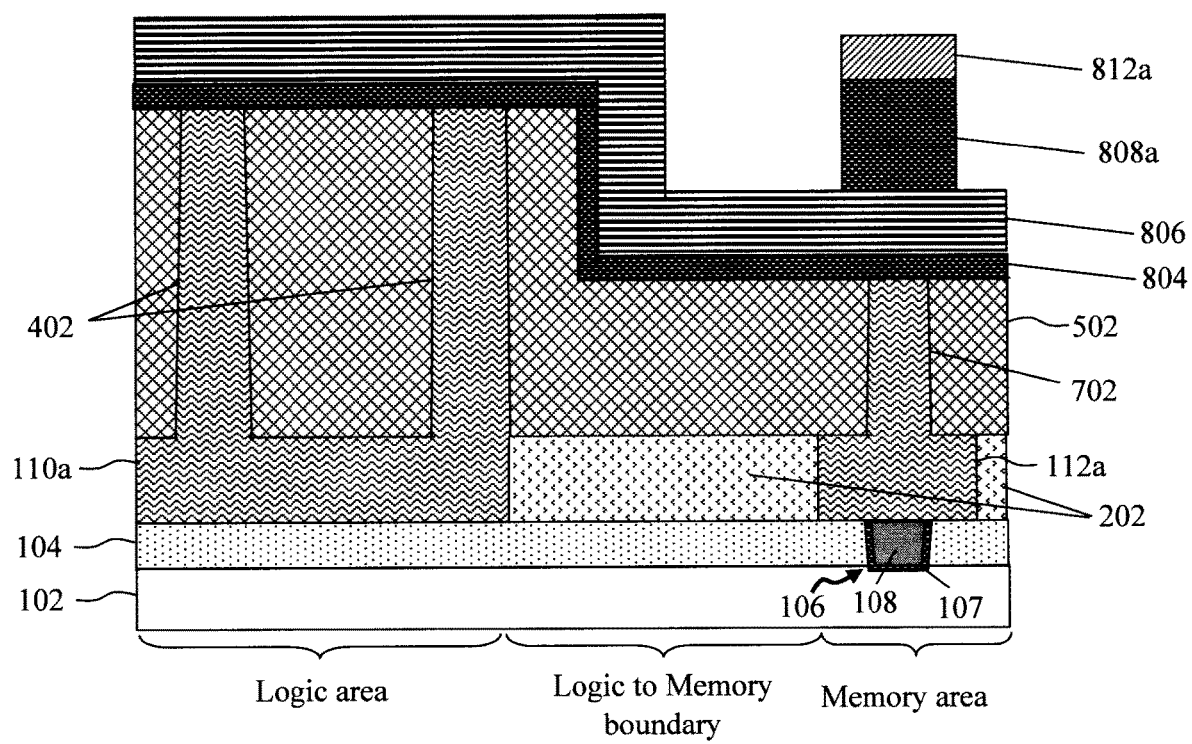
FIG. 9 is a cross-sectional diagram illustrating the pattern from patterned photoresist having been transferred to a hardmask layer of the lithographic stack, and the pattern from patterned hardmask layer having been transferred to a top electrode layer of the MRAM stack according to an embodiment of the present invention.

As shown in FIG. 8, MRAM stack 802 includes a bottom electrode layer 804 disposed on dielectric material 502/top vias 402/bottom contact via 702, a magnetic tunnel junction (MTJ) layer 806 disposed on the bottom electrode layer 804, and a top electrode layer 808 disposed on the MTJ layer 806. Suitable materials for the bottom electrode layer 804 and the top electrode layer 808 include, but are not limited to, tungsten (W), tungsten nitride (WN), tantalum (Ta), tantalum nitride (TaN), titanium (Ti), titanium nitride (TiN), ruthenium (Ru), aluminum (Al) and/or any other suitable metals. A process such as CVD or PVD can be employed to deposit the bottom electrode layer 804 onto dielectric material 502/top vias 402/bottom contact via 702 and/or to deposit top electrode layer 808 onto the MTJ layer 806. According to an exemplary embodiment, bottom electrode layer 804 has thickness of from about 5 nm to about 30 nm and ranges therebetween, and top electrode layer 808 has a thickness of from about 50 nm to about 150 nm and ranges therebetween.

MTJ layer 806 can have a variety of different configurations. In general, however, MTJ layer 806 includes at least one fixed (or reference) layer 806a separated from at least one free layer 806c by a tunnel barrier layer 806b. See magnified view 801. Suitable materials for the fixed layer(s) 806a and the free layer(s) 806c include, but are not limited to, a metal or combination of metals such as cobalt (Co), iron (Fe), nickel (Ni), manganese (Mn), platinum (Pt), palladium (Pd), ruthenium (Ru), and combinations thereof, e.g., alloys containing at least one of the foregoing metals such as CoFeB. A process such as evaporation or sputtering can be employed to deposit fixed layer(s) 806a onto bottom electrode layer 804 and/or to deposit free layer(s) 806c onto tunnel barrier layer 806b. According to an exemplary embodiment, fixed layer(s) 806a and free layer(s) 806c each have a thickness of from about 2 nm to about 10 nm and ranges therebetween. Suitable materials for tunnel barrier layer 806b include, but are not limited to, aluminum oxide (AlOx) and/or magnesium oxide (MgO). A process such as CVD, ALD or PVD can be employed to deposit tunnel barrier layer 806b onto bottom electrode layer 804. According to an exemplary embodiment, tunnel barrier layer 806b has a thickness of from about 2 nm to about 10 nm and ranges therebetween.

In order to pattern MRAM stack 802, a standard lithographic stack 810 is formed on the MRAM stack 802. As shown in FIG. 8, lithographic stack 810 includes a hardmask layer 812 (e.g., silicon nitride (SiN) and/or silicon dioxide (SiO$_2$)) disposed on the MRAM stack 802, an organic planarizing layer (OPL) 814 disposed on the hardmask layer 812, an antireflective coating (ARC) layer 816 disposed on the OPL 814, and a patterned photoresist 818 disposed on the ARC layer 816. The patterned photoresist 818 marks the footprint and location of an MRAM cell that will be patterned in MRAM stack 802 on bottom contact via 702 over the memory area of substrate 102 (see below).

Standard lithography and etching techniques using, e.g., a directional (anisotropic) etching process such as RIE, are then employed to transfer the pattern from patterned photoresist 818 to hardmask layer 812, after which any remaining OPL 814, ARC layer 816 and photoresist 818 are removed. See FIG. 9. The patterned hardmask layer 812 is now given the reference numeral 812a. The pattern from patterned hardmask layer 812a is then transferred to the top electrode layer 808 to pattern the top electrode layer 808 into top electrode 808a. According to an exemplary embodiment, RIE or ion beam etching is used to pattern the top electrode layer 808.

Figure 10:
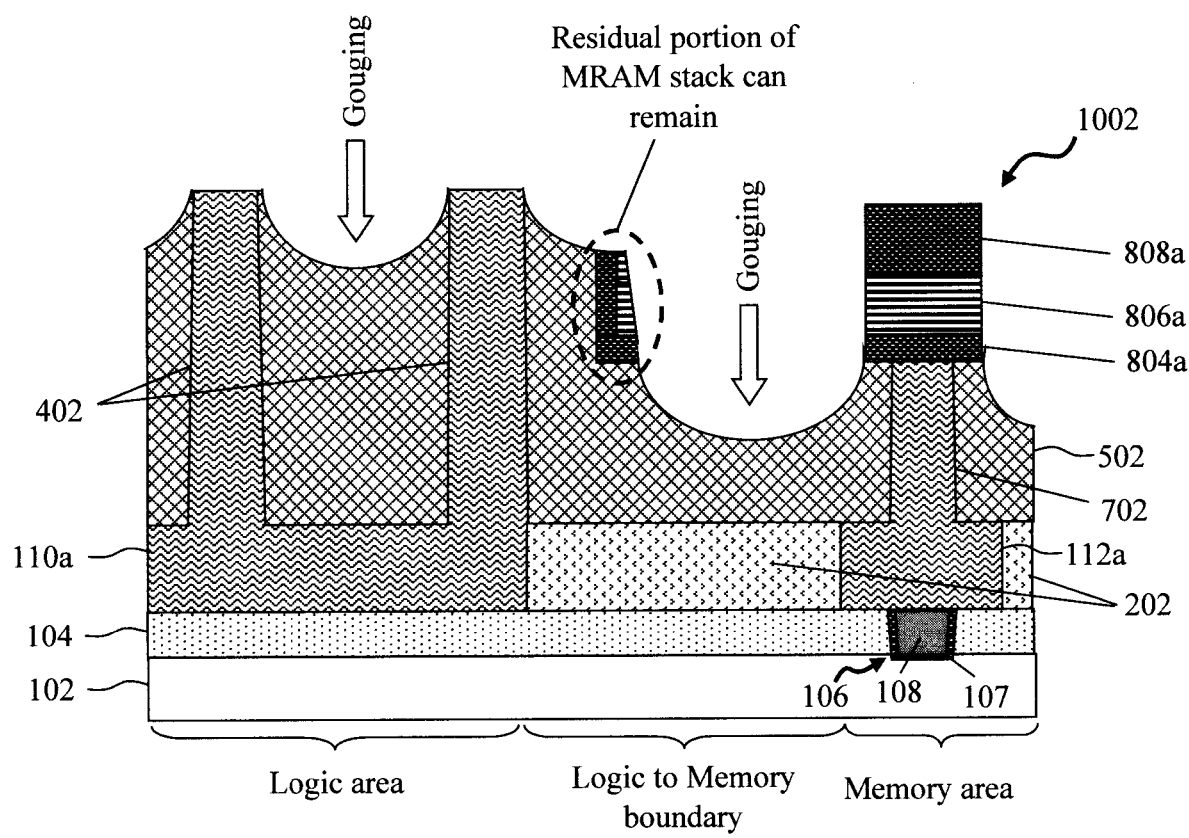
FIG. 10 is a cross-sectional diagram illustrating an ion beam etch of an MTJ layer and a bottom electrode layer of the MRAM stack having been used to form an MRAM cell in the memory area of the substrate over the bottom contact via according to an embodiment of the present invention.

An ion beam etch of MTJ layer 806 and bottom electrode layer 804 is then performed to form an MRAM cell 1002 from MRAM stack 802 in the memory area of the substrate 102 (after which patterned hardmask layer 812a is removed). See FIG. 10. The patterned MTJ 806 and bottom electrode layer 804 forms an MTJ 806a and a bottom electrode 804a, respectively. As shown in FIG. 10, MRAM cell 1002 is formed over bottom contact via 702 which, as described above, is self-aligned to the metal pad 112a/bottom contact. Conductive via 106 accesses the MRAM cell 1002 by way of the bottom contact via 702 and the metal pad 112a/bottom contact.

The ion beam etch of MRAM stack 802 lands on the underlying dielectric material 502. According to an exemplary embodiment, this ion beam etch of MRAM stack 802 involves an over-etch to reduce foot flares in the bottom electrode 804a which, as shown in FIG. 10, gouges the dielectric material 502. This dielectric along with metal residue from the ion beam etch of MRAM stack 802 gets redistributed onto the sidewalls of MRAM cell 1002. Metal residue on the MTJ 806a sidewall can undesirably lead to shorts across the junction. Thus, following patterning of the MRAM cell 1002, a clean-up ion beam etch is preferably performed to remove metal residue and any dielectric that has been redistributed along the MRAM cell 1002 sidewall. This clean-up etch can further gouge the dielectric material 502 creating a surface topography. However, dielectric material 502 fully surrounds the top vias 402 in the logic area and bottom contact via 702 in the memory area of substrate 102 and, as described above, provides a thick protective layer for underlying metal line 110a in the logic area and metal pad 112a beneath the MRAM cell 1002 (i.e., the recessed dielectric material 502 in the memory area has a thickness $T_{DIEL}$ of from about 50 nm to about 200 nm and ranges therebetween—see FIG. 7), in order to prevent this gouging from exposing any of the underlying interconnects (i.e., metal line/pad 110a/112a).

According to an exemplary embodiment, the clean-up etch is performed using a low-voltage, high angle ion beam etch. For instance, by way of example only, a high angle denotes a beam angle (relative to the surface of the workpiece) of greater than about 60°, e.g., from about 60° to about 80° and ranges therebetween. A low-voltage denotes an ion beam voltage or energy of less than about 300 volts (V), e.g., from about 100V to about 300V and ranges therebetween. By comparison, the ion beam etch of MRAM stack 802 is performed using a high-voltage, intermediate or low angle ion beam etch. For instance, by way of example only, angle for ion beam etch denotes a beam angle θ (relative to the surface of the workpiece—see below) of from about 5° to about 60° and ranges therebetween. A high-voltage denotes an ion beam voltage or energy of greater than 200V.

It is notable that, following the patterning of MRAM cell 1002, a residual portion of the MRAM stack 802 can potentially remain in the area of the logic-to-memory boundary of substrate 102 at the juncture of the recess in dielectric material 502. See FIG. 10. However, as will be described in detail below, this residual portion of MRAM stack 802 will be selectively removed following formation of top contacts.

Figure 11:
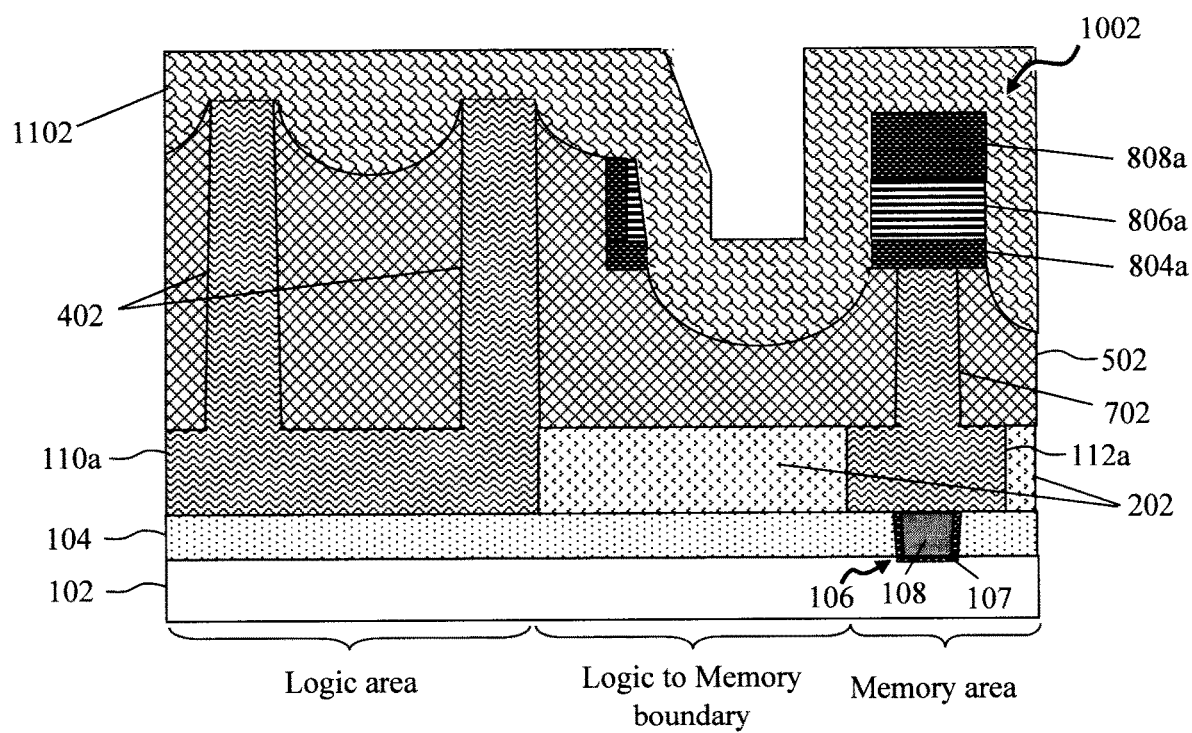
FIG. 11 is a cross-sectional diagram illustrating an encapsulation layer having been deposited onto the dielectric material over the top vias in the logic area of the substrate and the MRAM cell in the memory area of the substrate according to an embodiment of the present invention.

An encapsulation layer 1102 is then deposited onto dielectric material 502 over the top vias 402 in the logic area of substrate 102 and the MRAM cell 1002 in the memory area of substrate 102. See FIG. 11. Suitable materials for encapsulation layer 1102 include, but are not limited to, SiN, SiCN and/or SiCNH. A process such as CVD, ALD or PVD can be employed to deposit the encapsulation layer 1102. As shown in FIG. 11, encapsulation layer 1102 conforms to the surface topography of dielectric material 502 and along the top and sidewalls of MRAM cell 1002. According to an exemplary embodiment, encapsulation layer 1102 has a thickness of from about 2 nm to about 10 nm and ranges therebetween.

Figure 12:
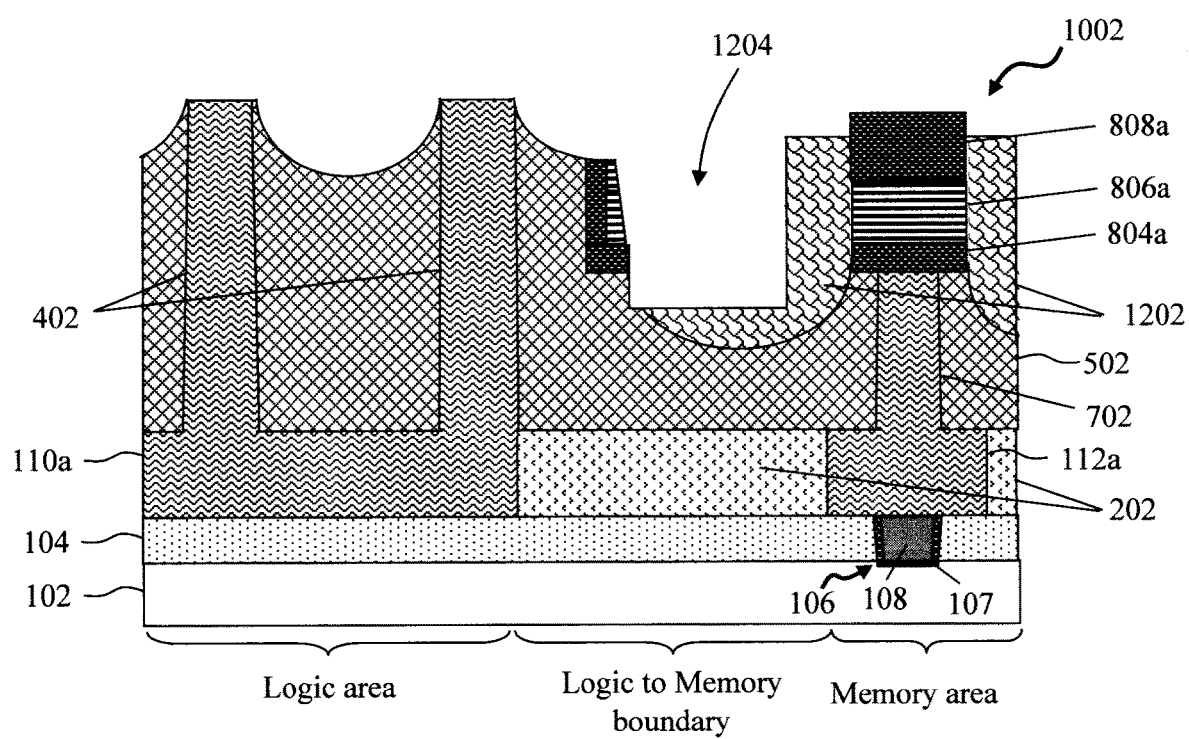
FIG. 12 is a cross-sectional diagram illustrating an etch back of the encapsulation layer having been performed to form spacers along the opposite sidewalls of the MRAM cell according to an embodiment of the present invention.
Figure 13:
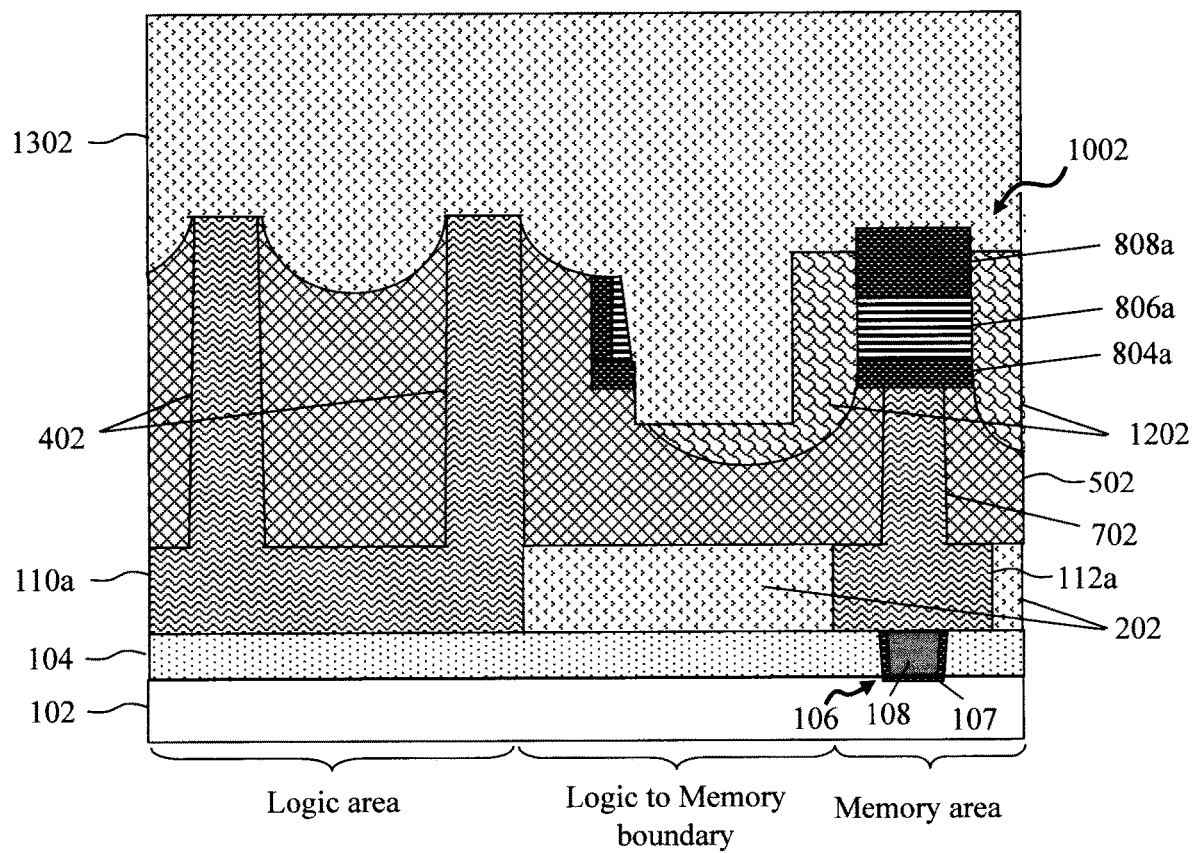
FIG. 13 is a cross-sectional diagram illustrating a (second) ILD having been deposited onto the dielectric material (over the top vias and MRAM cell) filling surface gouges in the dielectric material in the logic area of the substrate, and filling a gap in the logic-to-memory boundary area of the substrate according to an embodiment of the present invention.

Encapsulation layer 1102 is used to form spacers along the sidewalls of MRAM cell 1002 that will protect the MRAM cell 1002 during subsequent processing steps. Thus, as shown in FIG. 12, an etch back of encapsulation layer 1102 is next performed to remove encapsulation layer 1102 from horizontal surfaces. Following the etch back, what remains are spacers 1202 along the opposite sidewalls of MRAM cell 1002. According to an exemplary embodiment, the etch back of encapsulation layer 1102 is performed using a directional (anisotropic) etching process such as RIE.

As shown in FIG. 12, a gap 1204 is present in the logic-to-memory boundary area of substrate 102 between the top vias 402 in the logic area of substrate 102 and the MRAM cell 1002 in the memory area of substrate 102. An ILD 1302 is then deposited onto dielectric material 502 (over top vias 402 and MRAM cell 1002) filling the surface gouges in dielectric material 502 in the logic area of substrate 102, and filling the gap 1204 in the logic-to-memory boundary area of substrate 102. See FIG. 13. As provided above, suitable ILD 1302 materials include, but are not limited to, oxide low-κ materials such as SiOx and/or oxide ULK-ILD materials such as pSiCOH. A process such as CVD, ALD or PVD can be employed to deposit the ILD 1302 onto dielectric material 502.

Figure 14:
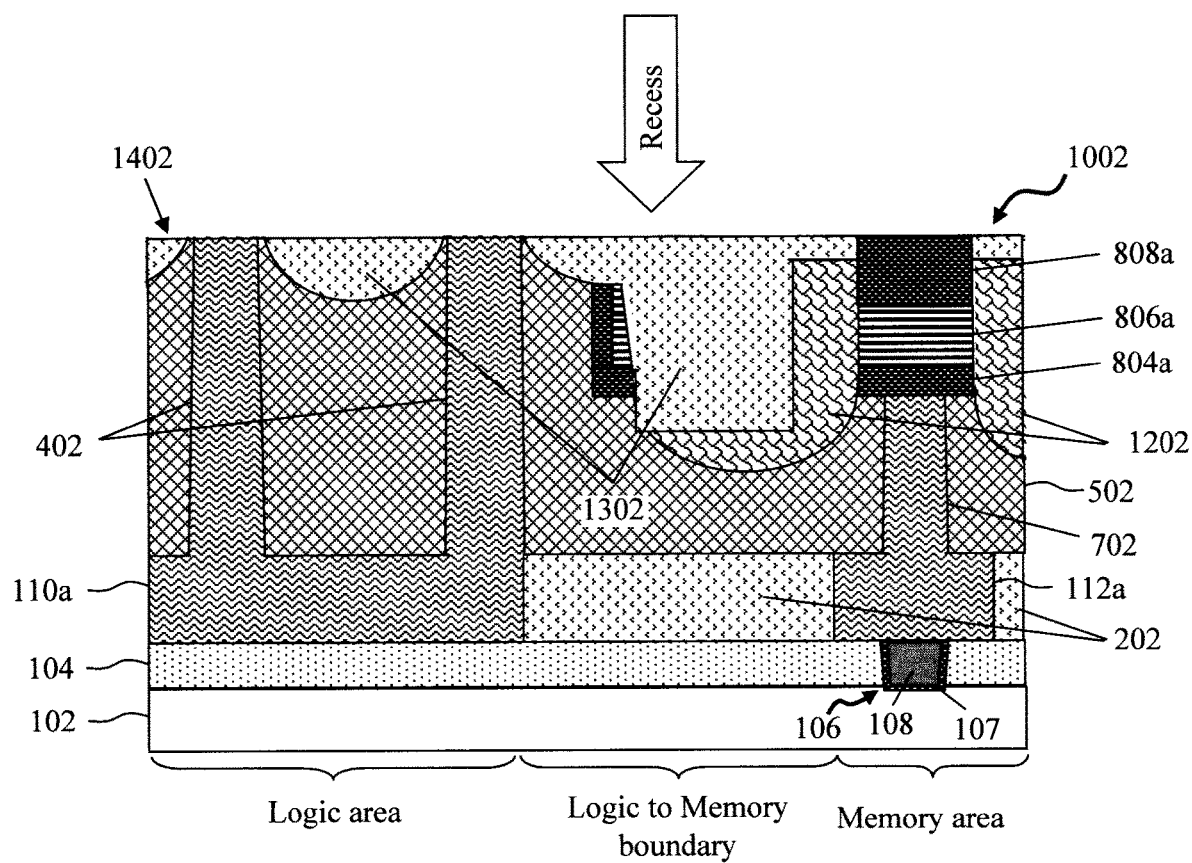
FIG. 14 is a cross-sectional diagram illustrating the second ILD having been recessed to the tops of the vias/MRAM cell according to an embodiment of the present invention.

Following deposition, the ILD 1302 is recessed to the tops of vias 402/MRAM cell 1002 using a process such as CMP. See FIG. 14. As shown in FIG. 14, this recessing of ILD 1302 provides a flat, planar surface 1402 along which the tops of vias 402 are exposed in the logic area of substrate 102, and the top of MRAM cell 1002 (i.e., top electrode 808a) is exposed in the memory area of the substrate 102. This will enable the formation of top contacts to vias 402 and MRAM cell 1002.

Figure 15:
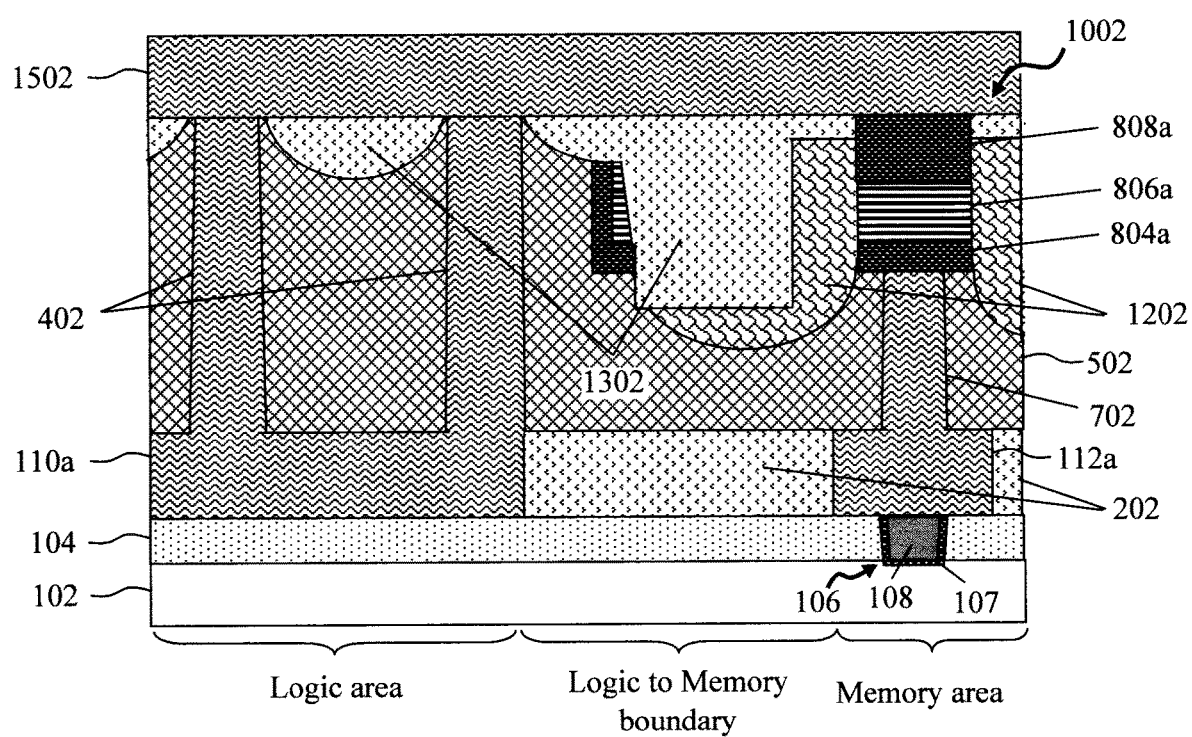
FIG. 15 is a cross-sectional diagram illustrating a top contact metal layer having been deposited over the dielectric material and second ILD according to an embodiment of the present invention.

Namely, as shown in FIG. 15, a top contact metal layer 1502 is next deposited onto surface 1402 over dielectric material 502 and ILD 1302 (and vias 402/MRAM cell 1002). Suitable metals for top contact metal layer 1502 include, but are not limited to, Ru, Co and/or W. The metal(s) for top contact metal layer 1502 can be deposited using a process such as evaporation, sputtering, or electrochemical plating. Following deposition, top contact metal layer 1502 can be planarized using a process such as CMP. According to an exemplary embodiment, top contact metal layer 1502 has a thickness of from about 20 nm to about 200 nm and ranges therebetween. As shown in FIG. 15, top contact metal layer 1502 is in direct contact with vias 402 in the logic area of substrate 102, and with top electrode 808a of MRAM cell 1002 in the memory area of substrate 102.

Figure 16:
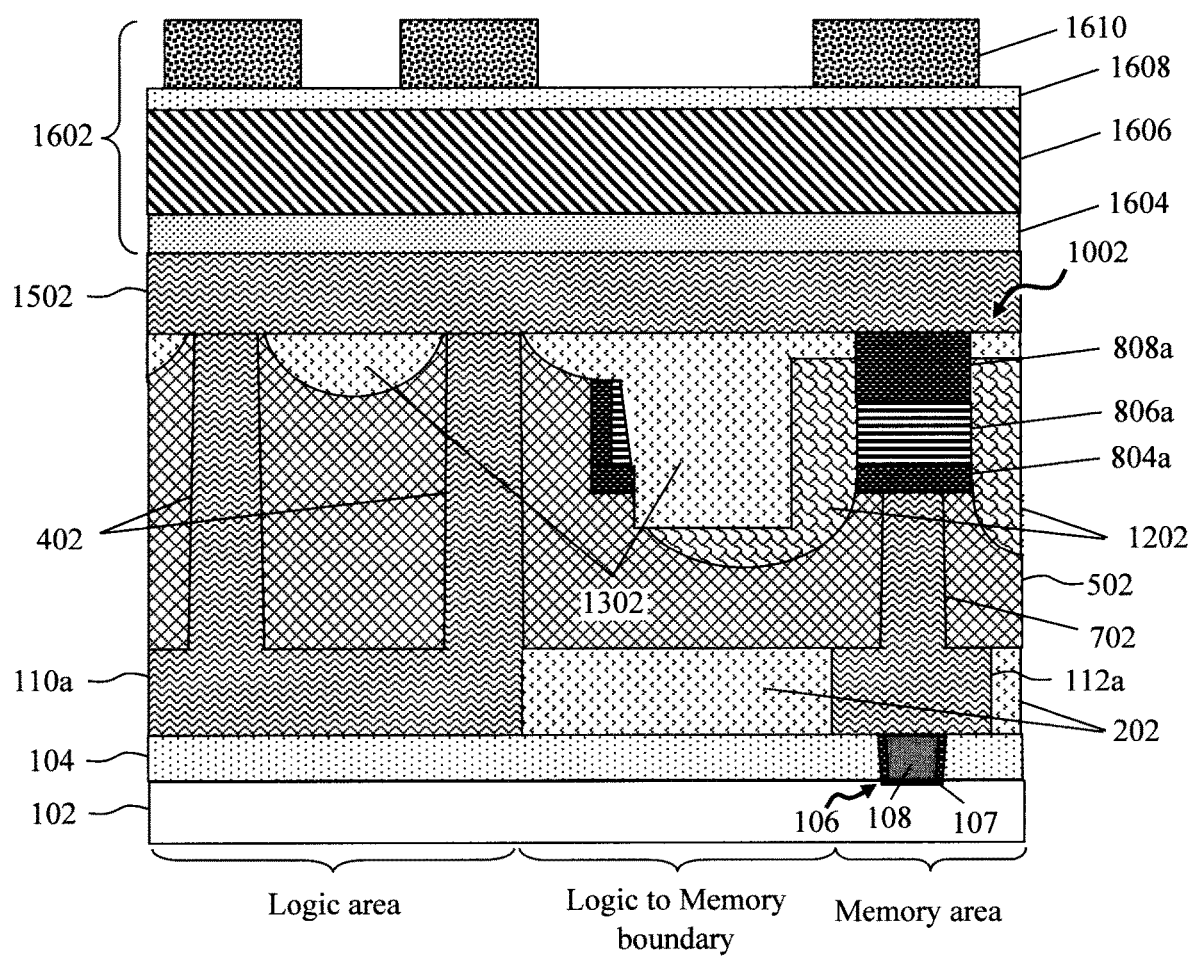
FIG. 16 is a cross-sectional diagram illustrating a lithographic stack having been formed on the top contact metal layer according to an embodiment of the present invention.

A standard lithographic stack 1602 is then formed on top contact metal layer 1502. See FIG. 16. As shown in FIG. 16, lithographic stack 1602 includes a hardmask layer 1604 (e.g., SiN and/or SiO$_2$) disposed on top contact metal layer 1502, an OPL 1606 disposed on the hardmask layer 1604, an ARC layer 1608 disposed on the OPL 1606, and a patterned photoresist 1610 disposed on the ARC layer 1608. The patterned photoresist 1610 marks the footprint and location of top contacts that will be patterned in top contact metal layer 1502 (see below).

Standard lithography and etching techniques using, e.g., a directional (anisotropic) etching process such as RIE, are then employed to transfer the pattern from patterned photoresist 1610 to hardmask layer 1604, after which any remaining OPL 1606, ARC layer 1608 and photoresist 1610 are removed. See FIG. 17. The patterned hardmask layer 1604 is now given the reference numeral 1604a. The pattern from patterned hardmask layer 1604a is then transferred to the top contact metal layer 1502 to pattern the top contact metal layer 1502 into (first) top contacts 1702 over (recessed) ILD 1302 in direct contact with vias 402 in the logic area of substrate 102, and (second) top contact 1704 over (recessed) ILD 1302 in direct contact with top electrode 808a of MRAM cell 1002 in the memory area of substrate 102. According to an exemplary embodiment, a directional (anisotropic) etching process such as RIE is used to pattern the top contact metal layer 1502. Following patterning of the top contact metal layer 1502 into top contacts 1702/1704, any remaining hardmask layer 1604a is removed.

Figure 17:
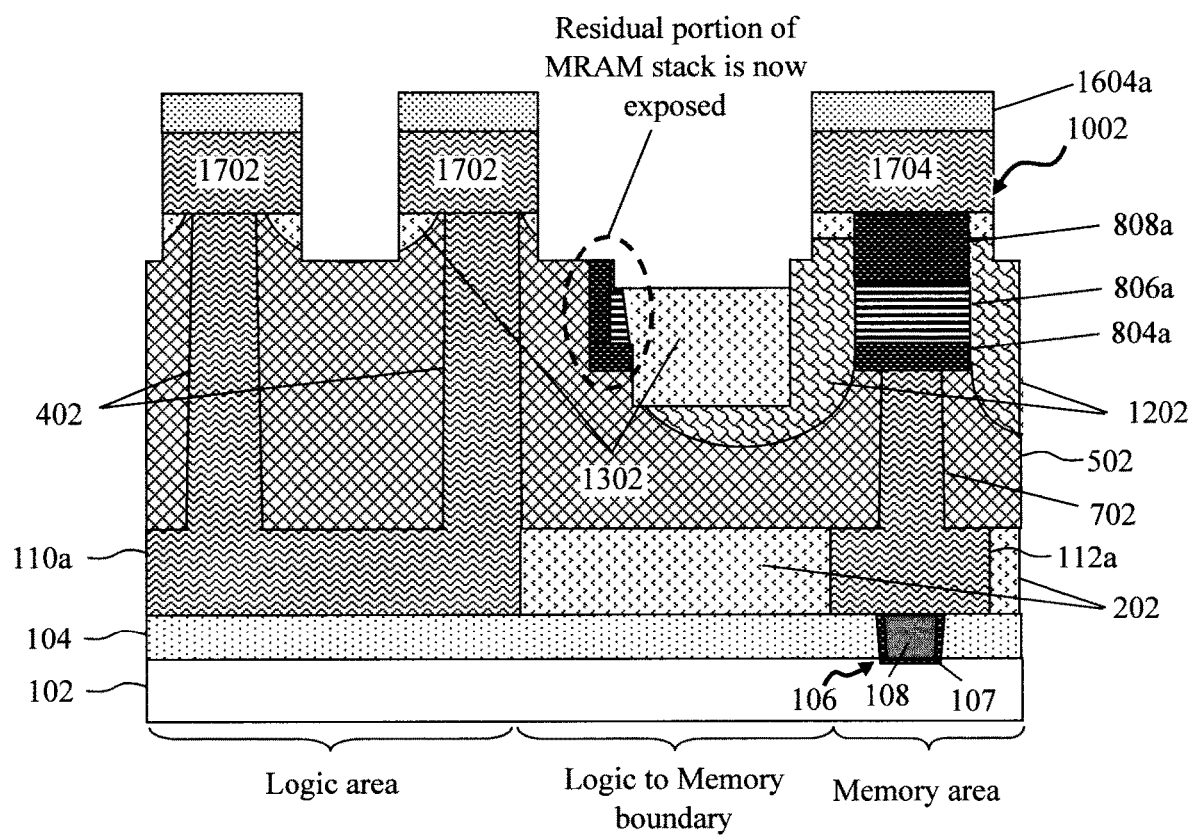
FIG. 17 is a cross-sectional diagram illustrating a hardmask layer of the lithographic stack having been patterned, and the patterned hardmask layer having been used to pattern the top contact metal layer into (first) top contacts over the second ILD in direct contact with the first top vias in the logic area of the substrate, and a (second) top contact over the second ILD in direct contact with a top electrode of the MRAM cell in the memory area of the substrate according to an embodiment of the present invention.

As shown in FIG. 17, the etch of top contact metal layer 1502 extends into the underlying ILD 1302, exposing the residual portion of the MRAM stack 802 (if any) that remains in the area of the logic-to-memory boundary of substrate 102 (see above). Doing so enables this residual portion of the MRAM stack 802 to be selectively removed.

Figure 18:
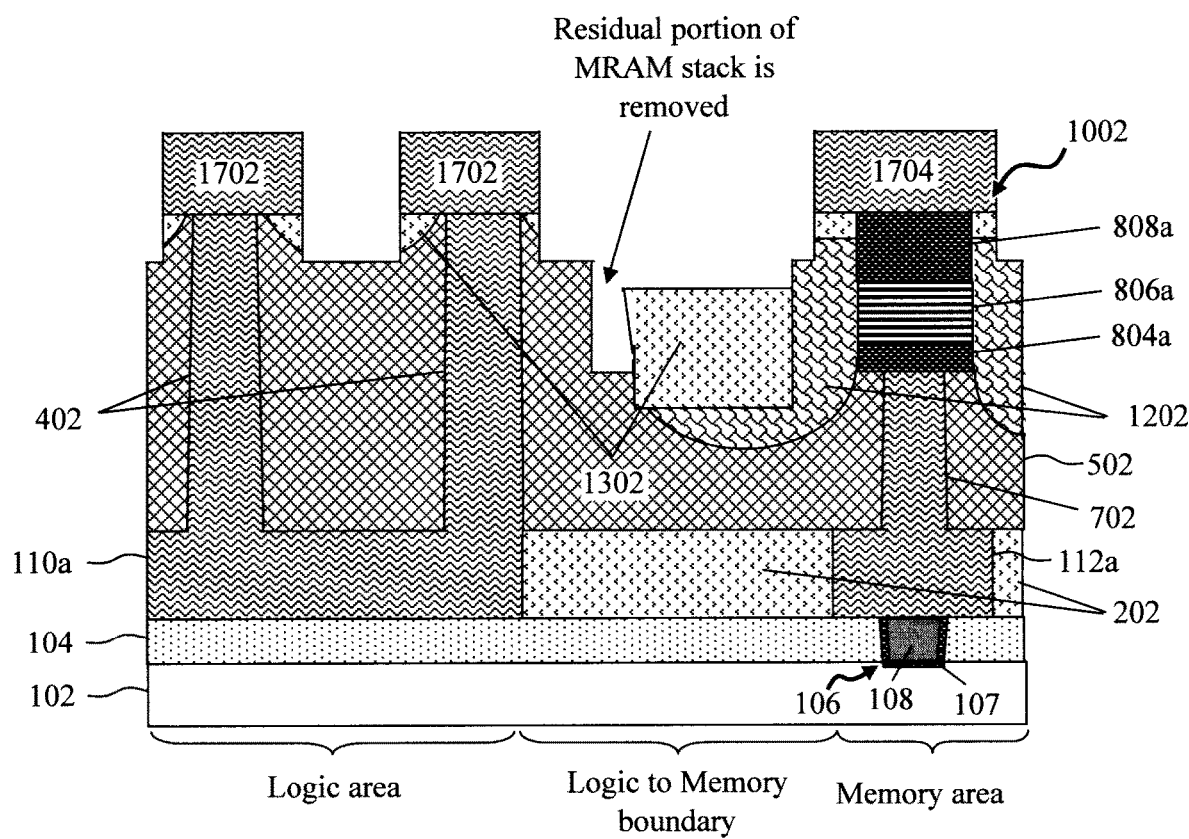
FIG. 18 is a cross-sectional diagram illustrating a residual portion of the MRAM stack having been selectively removed according to an embodiment of the present invention.
Figure 19:
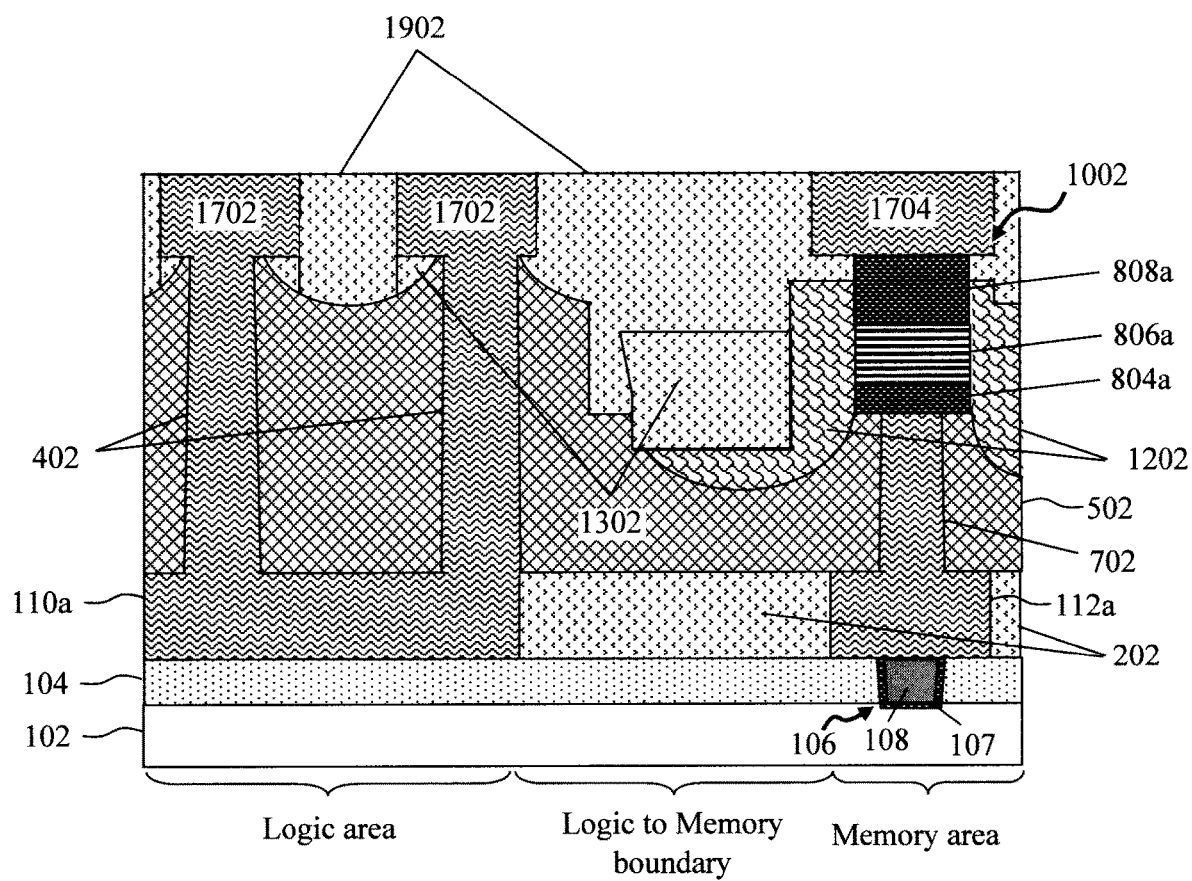
FIG. 19 is a cross-sectional diagram illustrating a (third) ILD having been deposited onto the dielectric material and second ILD, filling gaps between the top contacts according to an embodiment of the present invention.

Namely, as shown in FIG. 18 a nondirectional (isotropic) etching process such as a wet chemical etch is then employed to remove the residual portion of the MRAM stack 802 selective to ILD 1302. It is notable that during removal of this residual portion of the MRAM stack 802 from ILD 1302, spacers 1202 are in place along the sidewalls of MRAM cell 1002 protecting MRAM cell 1002 from the etchant.

Finally, an ILD 1902 is deposited onto dielectric material 502 and ILD 1302, filling the gaps between top contacts 1702 and top contact 1704. See FIG. 19. As provided above, suitable ILD 1902 materials include, but are not limited to, oxide low-κ materials such as SiOx and/or oxide ULK-ILD materials such as pSiCOH. According to an exemplary embodiment, the same material is used for ILD 1302 and ILD 1902. In that case, the boundaries shown in FIG. 19 between ILD 1302 and ILD 1902 are merely provided for ease and clarity of depiction. A process such as CVD, ALD or PVD can be employed to deposit the ILD 1902. Following deposition, the ILD 1902 can be planarized using a process such as CMP so as to provide access to top contacts 1702 and top contact 1704. See FIG. 19.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming an embedded magnetic random access memory (MRAM) device, the method comprising the steps of:
   depositing a cap layer onto a substrate, wherein the substrate comprises a logic-to-memory boundary area separating a logic area of the substrate from a memory area of the substrate;
   forming a metal line on the cap layer over the logic area of the substrate, and a metal pad on the dielectric cap layer over the memory area of the substrate;
   patterning i) the metal line to form first top vias over an unpatterned portion of the metal line, and ii) the metal pad to form a second top via over an unpatterned portion of the metal pad;
   depositing a dielectric material onto the substrate surrounding the first top vias and the second top via;
   recessing the second top via and the dielectric material in the memory area of the substrate, wherein following the recessing what remains of the second top via serves as a bottom contact via that is self-aligned to the unpatterned portion of the metal pad which serves as a bottom contact;
   forming an MRAM cell over the bottom contact via in the memory area of the substrate; and
   forming first top contacts in contact with the first top vias and a second top contact in contact with the MRAM cell.

2. The method of claim 1, further comprising the steps of:
   depositing an interlayer dielectric (ILD) onto the dielectric material over the first top vias and the MRAM cell;
   recessing the ILD to expose the first top vias and the MRAM cell; and
   forming the first top contacts over the ILD in contact with the first top vias and the second top contact over the ILD in contact with the MRAM cell.

3. The method of claim 1, wherein the cap layer comprises a material selected from the group consisting of: silicon oxide (SiOx), silicon carbide (SiC), silicon nitride (SiN), silicon carbon nitride (SiCN), hydrogen containing silicon carbon nitride (SiCNH), and combinations thereof.

4. The method of claim 1, wherein at least one conductive via is present in the dielectric cap layer over the memory area of the substrate.

5. The method of claim 1, wherein the metal line and the metal pad each comprises a metal selected from the group consisting of: ruthenium (Ru), cobalt (Co), tungsten (W), and combinations thereof.

6. The method of claim 1, further comprising the steps of:
   forming a block mask on the dielectric material covering the first top vias in the logic area of the substrate; and
   recessing the second top via and the dielectric material in the memory area of the substrate using the block mask.

7. The method of claim 1, further comprising the steps of:
   forming an MRAM stack on the dielectric material over the first top vias in the logic area of the substrate and over the bottom contact via in the memory area of the substrate, wherein the MRAM stack comprises a bottom electrode layer, a magnetic tunnel junction (MTJ) layer disposed on the bottom electrode layer, and a top electrode layer disposed on the MTJ layer; and
   patterning the MRAM stack to form the MRAM cell over the bottom contact via in the memory area of the substrate.

8. The method of claim 7, further comprising the steps of:
   depositing a top contact metal layer onto the ILD over the first top vias and the MRAM cell; and
   patterning the top contact metal layer into the first top contacts in contact with the first top vias and the second top contact in contact with the MRAM cell.

9. The method of claim 8, wherein the top contact metal layer comprises a metal selected from the group consisting of: Ru, Co, W, and combinations thereof.

10. The method of claim 8, wherein following the patterning of the MRAM stack a residual portion of the MRAM stack remains in the logic-to-memory boundary area of the substrate, the method further comprising the step of:
    exposing the residual portion of the MRAM stack during the patterning of the top contact metal layer; and
    removing the residual portion of the MRAM stack that has been exposed.

11. The method of claim 1, further comprising the step of:
    forming spacers along sidewalls of the MRAM cell.

12. The method of claim 11, wherein the spacers comprise a material selected from the group consisting of: SiN, SiCN, SiCNH, and combinations thereof.

13. A method of forming an embedded MRAM device, the method comprising the steps of:
    depositing a cap layer onto a substrate, wherein the substrate comprises a logic-to-memory boundary area separating a logic area of the substrate from a memory area of the substrate;

forming a metal line on the cap layer over the logic area of the substrate, and a metal pad on the dielectric cap layer over the memory area of the substrate;

patterning i) the metal line to form first top vias over an unpatterned portion of the metal line, and ii) the metal pad to form a second top via over an unpatterned portion of the metal pad;

depositing a dielectric material onto the substrate surrounding the first top vias and the second top via;

recessing the second top via and the dielectric material in the memory area of the substrate, wherein following the recessing what remains of the second top via serves as a bottom contact via that is self-aligned to the unpatterned portion of the metal pad which serves as a bottom contact;

forming an MRAM stack on the dielectric material over the first top vias in the logic area of the substrate and over the bottom contact via in the memory area of the substrate, wherein the MRAM stack comprises a bottom electrode layer, an MTJ layer disposed on the bottom electrode layer, and a top electrode layer disposed on the MTJ layer;

patterning the MRAM stack to form an MRAM cell over the bottom contact via in the memory area of the substrate;

depositing an ILD onto the dielectric material over the first top vias and the MRAM cell;

recessing the ILD to expose the first top vias and the MRAM cell; and forming first top contacts and a second top contact over the ILD, wherein the first top contacts are in contact with the first top vias and the second top contact is in contact with the MRAM cell.

14. The method of claim 13, wherein the metal line, the metal pad, and the top contact metal layer each comprises a metal selected from the group consisting of: Ru, Co, W, and combinations thereof.

15. The method of claim 13, further comprising the steps of:

forming a block mask on the dielectric material covering the first top vias in the logic area of the substrate; and recessing the second top via and the dielectric material in the memory area of the substrate using the block mask.

16. The method of claim 13, further comprising the steps of:

depositing a top contact metal layer onto the ILD over the first top vias and the MRAM cell; and patterning the top contact metal layer into the first top contacts in contact with the first top vias and the second top contact in contact with the MRAM cell.

17. The method of claim 16, wherein following the patterning of the MRAM stack a residual portion of the MRAM stack remains in the logic-to-memory boundary area of the substrate, the method further comprising the steps of:

exposing the residual portion of the MRAM stack during the patterning of the top contact metal layer; and removing the residual portion of the MRAM stack that has been exposed.

18. The method of claim 13, further comprising the step of:

forming spacers along sidewalls of the MRAM cell, wherein the spacers comprise a material selected from the group consisting of: SiN, SiCN, SiCNH, and combinations thereof.

19. An embedded MRAM device, comprising:

a substrate comprising a logic-to-memory boundary area separating a logic area of the substrate from a memory area of the substrate;

a cap layer disposed on the substrate;

a metal line disposed on the cap layer over the logic area of the substrate;

a metal pad disposed on the cap layer over the memory area of the substrate;

top vias formed on the metal line;

a bottom contact via self-aligned to the metal pad, wherein the metal pad serves as a bottom contact of the MRAM device;

a dielectric material disposed on the substrate over the metal line and the metal pad and surrounding the top vias and the bottom contact via;

an MRAM cell formed over the bottom contact via in the memory area of the substrate;

spacers along sidewalls of the MRAM cell, wherein the spacers comprise a material selected from the group consisting of: SiN, SiCN, SiCNH, and combinations thereof;

first top contacts in contact with the top vias; and a second top contact in contact with the MRAM cell.

20. The embedded MRAM device of claim 19, wherein the metal line, the metal pad, the first top contacts and the second top contact each comprises a metal selected from the group consisting of: Ru, Co, W, and combinations thereof.

* * * * *